United States Patent
Wakiya et al.

(10) Patent No.: US 6,416,930 B2
(45) Date of Patent: Jul. 9, 2002

(54) COMPOSITION FOR LITHOGRAPHIC ANTI-REFLECTION COATING, AND RESIST LAMINATE USING THE SAME

(75) Inventors: Kazumasa Wakiya; Naotaka Kubota; Shigeru Yokoi; Masakazu Kobayashi, all of Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 09/799,554

(22) Filed: Mar. 7, 2001

(30) Foreign Application Priority Data

Mar. 31, 2000 (JP) ........................................ 2000-097479

(51) Int. Cl.$^7$ .................................................. G03F 7/11
(52) U.S. Cl. .................................. 430/273.1; 430/271.1
(58) Field of Search ........................... 430/273.1, 271.1, 430/510

(56) References Cited

U.S. PATENT DOCUMENTS

| | | | | |
|---|---|---|---|---|
| 3,445,231 A | * | 5/1969 | Nishio et al. | .................... 96/84 |
| 5,529,888 A | | 6/1996 | Watanabe et al. | |
| 6,268,105 B1 | * | 7/2001 | Arakatsu et al. | ............ 430/203 |

FOREIGN PATENT DOCUMENTS

| | | |
|---|---|---|
| JP | 62-062521 | 3/1987 |
| JP | 5-188598 | 7/1993 |
| JP | 6-110210 | 4/1994 |
| JP | 6-118630 | 4/1994 |
| JP | 6-148896 | 5/1994 |
| JP | 8-015859 | 1/1996 |
| JP | 8-095253 | 4/1996 |
| JP | 10-069091 | 3/1998 |
| JP | 2000-010294 | 1/2000 |

* cited by examiner

*Primary Examiner*—Rosemary Ashton
(74) *Attorney, Agent, or Firm*—Sughrue Mion, PLLC

(57) ABSTRACT

A composition includes a copolymer of vinylimidazole with a water-soluble film-forming monomer other than vinylimidazole, and a fluorine-containing surfactant. A resist laminate is obtained by forming an anti-reflection coating on the surface of a photoresist film, which anti-refection coating is composed of a coating solution obtained by dissolving the composition in water. The composition for lithographic anti-reflection coating has balanced compatibility with conventional photoresist compositions. By using the composition, a semiconductor device can be efficiently produced without the clogging of waste fluids in a waste fluid pipe, even when the application of the photoresist composition and the formation of the anti-reflection coating are sequentially performed using one coater. This composition is also advantageous for saving space in a clean room.

7 Claims, No Drawings

COMPOSITION FOR LITHOGRAPHIC ANTI-REFLECTION COATING, AND RESIST LAMINATE USING THE SAME

BACKGROUND OF THE INVENTION

1. Field of the Invention

The present invention relates to a composition for lithographic anti-reflection coating, and a resist laminate using the composition.

2. Description of the Related Art

Photolithography technique is employed in the manufacture of a semiconductor device, in which a photoresist film is formed on a substrate such as silicon wafer, the photoresist film is subjected to selective irradiation with an active ray or radiation such as ultraviolet ray, far ultraviolet ray, excimer laser, X-ray, and electron beam, is subjected to development to thereby form a resist pattern on the substrate. Such photoresists include a negative photoresist in which unexposed portions to the active ray or radiation are dissolved and removed in development, and a positive photoresist in which, in contrast, exposed portions to the active ray or radiation are dissolved and removed in development. In photolithography, these negative and positive photoresists are appropriately selected and used according to intended purpose.

In the photolithographic formation of a resist pattern, it is known that multiple interference of light occurs in a photoresist film, and the width of the resist pattern varies with a varying thickness of the photoresist film. The multiple interference of light occurs because irradiated light of single wavelength coming into the photoresist film formed on a substrate interferes with reflected light from the substrate, and the quantity of absorbed light energy varies in the thickness direction of the photoresist film. The variation in the thickness of photoresist film affects the width of the resulting resist pattern after development, to thereby deteriorate the dimensional precision of the resist pattern. Particularly, the deteriorated dimensional precision of the resist pattern becomes a significant problem when a fine pattern is formed on a substrate having steps, as the thickness of the photoresist film inevitably varies on projections and depressions of the steps. Demands have been made to develop a technique that can avoid the interferential action and can prevent deterioration in dimensional precision even in a fine pattern formed on a substrate having steps.

A conventional approach to reduce the interferential action includes the formation of an anti-reflection coating on the photoresist film, as described in, for example, Japanese Patent Laid-Open Nos. 5-188598 and 8-15859. In these conventional technologies, an anti-reflection coating is formed by using a coating solution mainly containing a water-soluble film-forming component and a fluorine-containing surfactant.

However, the conventional coating solution yields a precipitate when it is dissolved with a photoresist in an edge bead remover. When the application of the photoresist composition and the formation of an anti-reflection coating by the application of the coating solution are sequentially performed using one coater, a waste fluid pipe is plugged with waste fluids of the photoresist composition and the coating solution formed by rinsing with the edge bead remover. This problem has been conventionally solved by the arrangement of a coater for the composition for anti-reflection coating and a waste fluid pipe separately, in addition to a coater for the photoresist composition and a waste fluid pipe therefor. However, this type of equipment configuration requires extra time and effort in operations, and is not efficient, and is an obstacle to save space in a clean room.

Materials for anti-reflection coating are also proposed in, for example, Japanese Patent laid-Open Nos. 8-95253 and 10-69091, in addition to the above conventional technologies. These technologies, however, have not yet solved the above problems.

SUMMARY OF THE INVENTION

Accordingly, it is an object of the present invention to provide a composition for lithographic anti-reflection coating which has balanced compatibility with conventional photoresist composition, as well as to provide a resist laminate using the composition. By using the composition, a semiconductor device can be efficiently produced without the clogging of waste fluids of a coating solution and photoresist composition produced by the rinsing with an edge bead remover in a waste fluid pipe, even when the application of the photoresist composition and the formation of the anti-reflection coating are sequentially performed using one coater. This composition is also advantageous for saving space in a clean room.

Specifically, the present invention provides, in one aspect, a composition for lithographic anti-reflection coating, which includes a copolymer of vinylimidazole with a water-soluble film-forming monomer other than vinylimidazole; and a fluorine-containing surfactant.

In the composition, the water-soluble film-forming monomer may be at least one selected from among vinyl monomers, cellulosic monomers, and acrylic monomers.

The water-soluble film-forming monomer in the composition is preferably a vinyl monomer such as vinylpyrrolidone.

In the aforementioned composition, the weight ratio of vinylimidazole to the water-soluble film-forming component other than vinylimidazole is preferably in a range from 1:99 to 40:60, and is more preferably in a range from 5:95 to 20:80.

In another aspect, the present invention provides a resist laminate which is obtained by forming an anti-reflection coating on the surface of a photoresist film, which anti-reflection coating is prepared by the use of the composition.

DETAILED DESCRIPTION OF THE INVENTION

The present invention will now be described in detail below.

A composition of the present invention comprises a copolymer of vinylimidazole with a water-soluble film-forming monomer other than vinylimidazole.

The water-soluble film-forming monomer is not specifically limited and includes any of water-soluble film-forming monomers as far as they are soluble in water and have transparency to irradiated light. A preferred water-soluble film-forming monomer can form a uniform coating by a conventional coating means such as spin coating, does not form an altered or deteriorated layer between a photoresist film even when the resulting coating solution is applied on the photoresist film, and can form a coating which is sufficiently transparent to an active ray or radiation, has a small absorption coefficient and has a high transparency.

Such water-soluble film-forming monomers include, but are not limited to, vinyl alcohol, vinylpyrrolidone, vinyl acetate, and other vinyl monomers; hydroxypropylmethylcellulose phthalate, hydroxypropylmethylcellulose acetate phthalate, hydroxypropylmethylcellulose acetate succinate, hydroxypropylmethylcellulose hexahydrophthalate, hydroxypropylmethylcellulose, hydroxypropylcellulose, hydroxyethylcellulose, cellulose acetate hexahydrophthalate, carboxymethyl cellulose, ethyl cellulose, methyl cellulose, and other cellulosic monomers; N,N-dimethylacrylamide, N,N-dimethylaminopropylmethacrylamide, N,N-dimethylaminopropylacrylamide, N-methylacrylamide, diacetone acrylamide, N,N-dimethylaminoethyl methacrylate, N,N-diethylaminoethyl methacrylate, N,N-dimethylaminoethyl acrylate, acryloyl morpholine, acrylic acid, and other acrylic monomers. Among these, vinyl monomers are preferred, of which vinylpyrrolidone is advantageous. Each of these water-soluble film-forming monomers can be used alone or in combination.

The weight ratio of vinylimidazole to the water-soluble film-forming monomer other than vinylimidazole preferably falls in a range from 1:99 to 40:60, and more preferably from 5:95 to 20:80.

The invented composition further comprises a fluorine-containing surfactant (surface active agent). The fluorine-containing surfactant is not specifically limited as far as it contains at least one fluorine atom and has surface active effect. The fluorine-containing surfactant is preferably composed of at least one selected from a salt of an alkanolamine or quaternary ammonium compound with a compound represented by the following formula (I):

RfCOOH (I)

wherein Rf is a fluorinated hydrocarbon group in which part or all of the hydrogen atoms of a saturated or unsaturated hydrocarbon group having 2 to 20 carbon atoms are substituted with fluorine atoms; and a salt of an alkanolamine or quaternary ammonium compound with a compound represented by the following formula (II):

R'fSO$_3$H (II)

wherein R'f is a fluorinated hydrocarbon group in which part or all of the hydrogen atoms of a saturated or unsaturated hydrocarbon group having 2 to 20 carbon atoms are substituted with fluorine atoms.

Such compounds represented by the formula (I) include, for example, perfluoroheptanoic acid and perfluorooctanoic acid. The compounds represented by the formula (II) include, for example, perfluoropropylsulfonic acid, perfluorooctylsulfonic acid, and perfluorodecylsulfonic acid. Specifically, perfluorooctanoic acid is commercially available under the trade name of EF-201, and perfluorooctylsulfonic acid is available under the trade name of EF-101, both as products of Tohkem Products Corporation, Japan. These compounds can be advantageously used. Among them, perfluorooctylsulfonic acid is specifically preferred as it has a high inhibitory activity against interference, a high solubility in water and is easy to adjust the pH of the resulting composition. Further, when the safety of the human body should be considered, perfluorooctanoic acid is preferred. Furthermore, when using perfluorooctanoic acid, in order to adjust pH, acidic compounds such as organic sulfonic acid or the like may be added, if necessary. Such organic sulfonic acid may be exemplified by p-toluenesulfonic acid, dodecylbenzene sulfonic acid and the like.

The alkanolamine includes, but is not limited to, monoethanolamine, N-methylethanolamine, N-ethylethanolamine, diethanolamine, and triethanolamine, of which monoethanolamine is advantageously used.

The quaternary ammonium compound includes, for example, TMAH (tetramethylammonium hydroxide) and choline.

The aforementioned fluorine-containing surfactants are advantageous in that they are well-balanced in compatibility with conventional photoresist composition, and can ease the pH control of the system. Particularly, the use of an alkanolamine salt in this type of surfactants can advantageously yield a composition which has a the wide margin of coating property within a wide pH ranges and is resistant to gelation of the resulting solution.

The fluorine-containing surfactant may preferably comprise a salt of an alkanolamine or quaternary ammonium compound with the compound represented by the formula (I) and a salt of an alkanolamine or quaternary ammonium compound with the compound represented by the formula (II) in a weight ratio of the former to the latter from 4:1 to 1:4. By this configuration, the resulting coating exhibits no popcorn form causing interconnection failure, and can further inhibit the occurrence of intermixing.

A coating solution (coating composition) prepared by using the invented composition is generally in the form of an aqueous solution. The content of the copolymer in the coating solution is preferably 0.1% to 10.0% by weight, and the content of at least one fluorine-containing surfactant selected from among a salt of an alkanolamine or quaternary ammonium compound with the compound represented by the formula (I) and a salt of an alkanolamine or quaternary ammonium compound with the compound represented by the formula (II) is preferably 1.0% to 15.0% by weight.

The coating solution using the invented composition is generally used as an aqueous solution, but it may further comprise an organic alcohol solvent according to necessity, as the addition of an organic alcohol solvent such as isopropyl alcohol can improve the solubility of the fluorine-containing surfactant to thereby further improve the uniformity of the resulting coating. The amount of the organic alcohol solvent is preferably selected within a range not exceeding 20% by weight relative to the total weight of the coating solution. In order to improve the characteristic of coating, the coating solution may further comprise a variety of additives according to necessity, within a range not deteriorating the objects of the present invention.

A resist laminate according to the present invention has a two-layer structure composed of a photoresist film and an anti-reflection coating formed on the photoresist film, which anti-reflection coating is obtained by applying the composition for anti-reflection coating to the surface of the photoresist film. Such photoresists for use in the resist laminate are not specifically limited and can be freely selected from among those conventionally used, and any of positive photoresists and negative photoresists can be freely employed. Photoresists, which include a photosensitive substance and a film-forming substance and which can be developed with an aqueous alkali solution, are advantageously used.

Specifically advantageous resists are positive and negative photoresists having characteristics that can sufficiently meet the requirements in ultrafine processing in recent years. Such positive photoresists include those composed of a composition containing a quinonediazide photosensitive substance and a film-forming substance.

The quinonediazide photosensitive substance includes, for example, quionediazido-group-containing compounds as products of the partial or complete esterification or of the partial or overall amidation of a sulfonic acid of a quinonediazidosulfonic acid compound with a compound having a phenolic hydroxyl group or an amino group. Such quinonediazide compounds include, for example, ortho-benzoquinone diazide, ortho-naphthoquinone diazide, ortho-anthraquinone diazide, and other quinone diazide compounds. The compound having a phenolic hydroxyl group or an amino group includes, but is not limited to, 2,3,4-trihydroxybenzophenone, 2,3,4,4'-tetrahydroxybenzophenone, 2,2',4,4'-tetrahydroxybenzophenone, and other polyhydroxybenzophenones; aryl gallate, phenol, p-methoxyphenol, dimethylphenol, hydroquinone, bisphenol A, naphthol, pyrocatechol, pyrogallol, pyrogallol monomethyl ether, pyrogallol-1,3-dimethyl ether, gallic acid, partially esterified or etherized gallic acid having part of hydroxyl groups as intact, aniline, and p-aminodiphenylamine. Specifically preferred quinonediazido-group-containing compounds are completely or partially esterified products of the polyhydroxybenzophenone with naphthoquinone-1,2-diazido-5-sulfonyl chloride or naphthoquinone-1,2-diazido-4-sulfonyl chloride.

Effective substances as the film-forming substance include, for example, novolak resins obtained from phenol, cresol, xylenol or the like with an aldehyde; acrylic resins, copolymers of styrene with acrylic acid, polymers of hydroxystyrene, poly(vinyl hydroxybenzoate), poly(vinyl hydroxybenzal), and other alkali-soluble resins. Typically preferred positive photoresist compositions comprise, as a film-forming substance, a novolak resin prepared from cresol or xylenol, or both with an aldehyde. This novolak resin has no low-molecular weight fractions and has a weight average molecular weight from 2000 to 20000, and preferably from 5000 to 15000. Preferably, the positive photoresist composition contains the photosensitive substance in a proportion of 10 to 40 parts, and preferably 15 to 30 parts relative to 100 parts by weight of the film-forming substance.

The negative photoresist is not specifically limited, and includes known conventional negative photoresists, of which chemically amplified negative resists containing three components, a cross-linking agent, acid-generator, and base polymer, and being used as negative resists for the formation of a fine pattern, are specifically preferred.

The invented resist laminate may be prepared and used, for example, in the following manner. Initially, a photoresist film is formed on a substrate such as a silicon wafer, and a coating solution using the invented composition for anti-reflection coating is applied onto the photoresist film using a spinner, is then heated to form an anti-reflection coating on the photoresist film to thereby form a resist laminate of the invention having a two-layer structure. The heating is not always necessary, and the coating may not be heated when a satisfactory coating having excellent uniformity can be obtained by coating procedure alone.

Next, the photoresist film is selectively irradiated with an active ray or radiation such as ultraviolet ray or far ultraviolet ray (including excimer laser) via the anti-reflection coating using an exposure equipment (aligner), and is developed to form a resist pattern on the silicon wafer.

The anti-reflection coating should preferably have an optimum thickness to effectively reduce the interferential actin of the active ray or radiation, and the optimum thickness is an odd multiple of $\lambda/4n$, where $\lambda$ is the wavelength of the active ray or radiation used and n is the refractive index of the anti-reflection coating. For example, when the anti-reflection coating has a refractive index of 1.41, the optimum thickness to active ray or radiation is an odd multiple of 77 nm to ultraviolet ray (g-ray), an odd multiple of 65 nm to ultraviolet ray (i-ray), and an odd multiple of 44 nm to far ultraviolet ray (excimer laser). The actual thickness of the coating should be preferably within a range of ±5 nm of the optimum thickness.

The anti-reflection coating exhibits improving effect of the shape of the resist pattern in addition to anti-reflection effect, when it is formed on a chemically amplified negative or positive resist. Such a chemically amplified resist is generally affected by the action of an organic alkali vapor such as N-methyl-2-pyrrolidone, ammonia, pyridine, or triethylamine in the atmosphere of a semiconductor manufacture line, and acid deficiency occurs on the surface of the resist film. Consequently, the top of the resist pattern tends to become round in the case of a negative resist, and the resist patterns tend to be connected with each other in the form of hood in the case of a positive resist. According to the improving effect of the shape of resist pattern, a rectangular pattern shape (profile) can be obtained without the aforementioned phenomena. As thus described, the anti-reflection coating composition of the invention can also be advantageously used as a material for protective film of a chemically amplified resist.

The anti-reflection coating may be removed concurrently with the development of the photoresist film, but may be strip off prior to development in order to remove it completely. The anti-reflection coating can be strip off by, for example, applying a solvent that can dissolve and remove the anti-reflection coating onto the coating, while spinning the silicon wafer by a spinner, to thereby completely remove the anti-reflection coating alone. An aqueous solution containing a surfactant can be used as the solvent to remove the anti-reflection coating.

EXAMPLES

The present invention will now be illustrated in further detail with reference to several examples and comparative examples below, which are not intended to limit the scope of the invention.

Example 1

A positive photoresist (produced by Tokyo Ohka Kogyo Co., Ltd. under the trade name of "TSMR-AR80") containing a cresol novolak resin and a naphthoquinone diazide compound was applied on a silicon wafer using a spinner, and was heated on a hot plate at 90° C. for 90 sec. to form a photoresist film having a thickness of 1050 nm.

Separately, 500 g of a 20% aqueous solution of a perfluorooctylsulfonic acid ($C_8F_{17}SO_3H$) (produced by Tohkem Products Corporation under the trade name of "EF-101"), and 500 g of a 20% aqueous solution of perfluorooctanoic acid ($C_7F_{15}CO_2H$) (produced by Tohkem Products Corporation under the trade name of "EF-201") were added to 110 g of a 20% aqueous solution of monoethanolamine. To 100 g of the resulting mixture, 50 g of a 20% aqueous solution of a copolymer of vinylimidazole with vinylpyrrolidone (weight ratio 1:9) (produced by BASF AG under the trade name of "Luvitec VPMA 91"), and pure water was added to the resulting aqueous solution mixture to 1000 g to thereby yield a coating solution for anti-reflection coating according to the present invention.

The coating solution for anti-reflection coating was then applied onto the above-prepared photoresist film, was heated at 90° C. for 90 sec., to form an anti-reflection coating having a thickness of 64 nm to thereby yield a resist laminate of the present invention.

The resist laminate was then irradiated with i-ray through a mask pattern using a reducing-type projection aligner NSR-1755i7A (manufactured by Nikon Corporation). The laminate was then post-exposure baked (PEB) on a hot plate at 110° C. for 90 sec.; was subjected to puddle development in a 2.38% by weight aqueous tetramethylammonium hydroxide TMAH) solution at 23° C. for 60 sec., and was rinsed with pure water.

The above-formed photoresist pattern was subjected to scanning electron microscopic (SEM) observation to find that the pattern was satisfactory. In addition, no clogging was observed in a pipe in which waste fluids of the photoresist solution and of the coating solution for anti-reflection coating existed concurrently.

Example 2

The procedure of Example 1 was repeated, except that a coating solution prepared in the following manner was used as the coating solution for anti-reflection coating. To 500 g of a 20% aqueous solution of a perfluorooctylsulfonic acid ($C_8F_{17}SO_3H$) (produced by Tohkem Products Corporation under the trade name of "EF-101"), 40 g of a 20% aqueous solution of monoethanolamine was added, and 100 g of the resulting mixture was added to 50 g of a 20% aqueous solution of a copolymer of vinylimidazole with vinylpyrrolidone (weight ratio 1:9) (produced by BASF AG under the trade name of "Luvitec VPMA 91"), and pure water was added to the resulting aqueous solution mixture to 1000 g to thereby yield a coating solution for anti-reflection coating.

The formed resist pattern was subjected to observation in the same manner as in Example 1 to find that the pattern was satisfactory. Additionally, no clogging of waste fluid in the pipe occurred.

Example 3

The procedure of Example 1 was repeated, except that a coating solution prepared in the following manner was used as the coating solution for anti-reflection coating. To 500 g of a 20% aqueous solution of perfluorooctanoic acid ($C_7F_{15}CO_2H$) (produced by Tohkem Products Corporation under the trade name of "EF-201"), 55 g of a 20% aqueous solution of monoethanolamine was added, and 100 g of the resulting mixture was added to 50 g of a 20% aqueous solution of a copolymer of vinylimidazole with vinylpyrrolidone (weight ratio 1:9) (produced by BASF AG under the trade name of "Luvitec VPMA 91"), and pure water was added to the resulting aqueous solution mixture to 1000 g to thereby yield a coating solution for anti-reflection coating.

The formed resist pattern was subjected to observation in the same manner as in Example 1 to find that the pattern was satisfactory. Additionally, no clogging of waste fluid in the pipe occurred.

Comparative Example 1

The procedure of Example 1 was repeated, except that a coating solution prepared in the following manner was used as the coating solution for anti-reflection coating. To 110 g of a 20% aqueous solution of monoethanolamine, 500 g of a 20% aqueous solution of a perfluorooctylsulfonic acid ($C_8F_{17}SO_3H$) (produced by Tohkem Products Corporation under the trade name of "EF-101"), and 500 g of a 20% aqueous solution of perfluorooctanoic acid ($C_7F_{15}CO_2H$) (produced by Tohkem Products Corporation under the trade name of "EF-201") were added. To 100 g of the resulting solution mixture, 50 g of a 20% aqueous solution of polyvinylpyrrolidone was added, and pure water was added to the resulting mixture to 1000 g to thereby yield a coating solution for anti-reflection coating.

The formed resist pattern was subjected to observation in the same manner as in Example 1 to find that the pattern was satisfactory, but clogging of waste fluid in the pipe occurred.

Comparative Example 2

A photoresist pattern was formed in the same manner as in Example 1, except that a coating solution prepared in the following manner was used as the coating solution for anti-reflection coating. To 40 g of a 20% aqueous solution of monoethanolamine, 500 g of a 20% aqueous solution of a perfluorooctylsulfonic acid ($C_8F_{17}SO_3H$) (produced by Tohkem Products Corporation under the trade name of "EF-101") was added. To 100 g of the resulting mixture, 50 g of a 20% aqueous solution of a copolymer (produced by BASF AG, under the trade name of "VA-64") of vinylpyrrolidone with vinyl acetate (weight ratio 2:1) was added, and pure water was added to the resulting mixture to 1000 g to thereby yield a coating solution for anti-reflection coating.

The formed resist pattern was subjected to observation in the same manner as in Example 1 to find that the pattern was satisfactory, but clogging of waste fluid in the pipe occurred.

As described above, the present invention can provide a composition for lithographic anti-reflection coating which has well-balanced compatibility with conventional photoresist compositions, and can provide a resist laminate using the composition. By using the composition, a semiconductor device can be efficiently produced without the clogging of waste fluids of a coating solution and photoresist composition in a waste fluid pipe, even when the application of the photoresist composition and the formation of the anti-reflection coating are sequentially performed using one coater. This composition is also advantageous for saving space in a clean room.

Other embodiments and variations will be obvious to those skilled in the art, and this invention is not to be limited to the specific matters stated above.

What is claimed is:

1. A composition for lithographic anti-reflection coating, comprising:

a copolymer of vinylimidazole with a water-soluble film-forming monomer other than vinylimidazole; and a fluorine-containing surfactant.

2. A composition according to claim 1, wherein said water-soluble film-forming monomer is at least one selected from the group consisting of vinyl monomers, cellulosic monomers, and acrylic monomers.

3. A composition according to claim 2, wherein said water-soluble film-forming monomer is a vinyl monomer.

4. A composition according to claim 3, wherein said vinyl monomer is vinylpyrrolidone.

5. A composition according to any one of claims 1 to 4, wherein the weight ratio of said vinylimidazole to said water-soluble film-forming component other than vinylimidazole is in a range from 1:99 to 40:60.

6. A composition according to claim 5, wherein said weight ratio is in a range from 5:95 to 20:80.

7. A resist laminate being obtained by forming an anti-reflection coating on the surface of a photoresist film, said anti-reflection coating being prepared by the use of a composition according to claim 1.

* * * * *